(12) United States Patent
Chu

(10) Patent No.: US 7,845,395 B2
(45) Date of Patent: Dec. 7, 2010

(54) HEAT-DISSIPATING CASING STRUCTURE

(75) Inventor: Chung-Jun Chu, Taipei Hsien (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 697 days.

(21) Appl. No.: 11/772,497

(22) Filed: Jul. 2, 2007

(65) Prior Publication Data

US 2009/0009969 A1    Jan. 8, 2009

(51) Int. Cl.
*F28D 15/02* (2006.01)

(52) U.S. Cl. .............................. 165/104.33; 165/104.21

(58) Field of Classification Search ............ 165/104.33, 165/104.21, 104.26, 80.2, 80.3; 361/700, 361/702, 703, 714
See application file for complete search history.

(56) References Cited

U.S. PATENT DOCUMENTS

| | | | |
|---|---|---|---|
| 6,134,106 A * | 10/2000 | Tao et al. ................ | 361/679.52 |
| 6,167,949 B1 * | 1/2001 | Langley et al. ......... | 165/104.33 |
| 6,181,553 B1 * | 1/2001 | Cipolla et al. .......... | 361/679.54 |
| 6,349,035 B1 * | 2/2002 | Koenen ...................... | 361/719 |
| 6,445,580 B1 * | 9/2002 | Cohen et al. ........... | 361/679.47 |
| 2003/0121639 A1 * | 7/2003 | Nomura ...................... | 165/41 |
| 2004/0218362 A1 * | 11/2004 | Amaro et al. ............... | 361/697 |

* cited by examiner

*Primary Examiner*—Teresa J Walberg
(74) *Attorney, Agent, or Firm*—Rosenberg, Klein & Lee

(57) ABSTRACT

A heat-dissipating casing structure includes a base seat, a heat-dissipating module, and a casing. The heat-dissipating module is disposed on the base seat. The heat-dissipating module has a first heat-conducting block and a heat pipe, and one side of the heat pipe connects to the first heat-conducting block. The casing has an installed portion, and the casing is slidably assembled on the base seat for connecting the other side of the heat pipe with the casing via the installed portion. When the casing is slidably assembled on the base seat, the heat pipe is connected with the casing via the installed portion. Hence, the heat-dissipating module is assembled and replaced easily and rapidly. Moreover, the heat from a heat-generating element on the base seat is transmitted to the casing through the heat pipe for increasing heat-dissipating efficiency.

19 Claims, 13 Drawing Sheets

HEAT-DISSIPATING CASING STRUCTURE

BACKGROUND OF THE INVENTION

1. Field of the Invention

The present invention relates to a heat-dissipating casing structure, and particularly relates to a heat-dissipating casing structure for transmitting heat from a heat-generating element to a casing through a heat pipe in order to increase the heat-dissipating area.

2. Description of the Related Art

As the computer industry has developed the processing velocity of electronic devices (such as computers) has become faster and faster, subsequently the heat generated by the CPU has also increased. In order to dissipate the heat from the heat source to the external environment, a heat-dissipating device and a fan are usually used to help dissipate the heat.

A known heat-dissipating module includes a heat pipe that has a first side and a second side. The first side of the heat pipe connects to a heat-conducting block that is disposed on a heat-generating element for absorbing heat from the heat-generating element. The second side of the heat pipe is disposed on a casing. Hence, the heat from the heat-generating element is transmitted to the casing and is dissipated into the air. In the assembly process, the first side and the second side of the heat pipe are welded or adhered to the heat-conductive block and the casing, respectively.

However, because the first side and the second side of the heat pipe are respectively welded or adhered to the heat-conductive block and the casing, the assembly process is difficult. Moreover, the heat pipe of the heat-conductive block cannot be replaced.

SUMMARY OF THE INVENTION

The present invention provides a heat-dissipating casing structure. The structure includes a base seat and a casing. The casing can be slidably assembled on the base seat. When the casing is slidably assembled on the base seat, a heat-dissipating module is connected with the casing or the base seat at the same time via an installed portion that is disposed on the casing or the base seat. Hence, the heat from a heat-generating element on the base seat is transmitted to the casing. Therefore, the heat-dissipating module is assembled and can be replaced easily and rapidly. The casing further has a larger heat-dissipating area for increasing heat-dissipating efficiency.

A first aspect of the present invention is a heat-dissipating casing structure that includes a base seat, a heat-dissipating module, and a casing. The heat-dissipating module is disposed on the base seat. The heat-dissipating module has a first heat-conducting block and a heat pipe. One side of the heat pipe connects to the first heat-conducting block. The casing has an installed portion, and the casing is slidably assembled on the base seat for connecting the other side of the heat pipe with the casing via the installed portion.

A second aspect of the present invention is a heat-dissipating casing structure that includes a base seat, a heat-dissipating module, and a casing. The base seat has an installed portion. The heat-dissipating module is disposed on the base seat. The heat-dissipating module has a first heat-conducting block and a first heat pipe, and one side of the first heat pipe connects to the first heat-conducting block. The casing is slidably assembled on the base seat for connecting the other side of the first heat pipe with the casing via the installed portion.

The present invention has the following advantages. When the casing is slidably assembled on the base seat, the heat-dissipating module is connected with the casing or the base seat at the same time via the installed portion. Hence, the heat-dissipating module is assembled and can be replaced easily and rapidly. Moreover, the heat from the heat-generating element is transmitted to the casing through the heat pipe. Because the casing has a larger heat-dissipating area, the heat-dissipating efficiency is increased.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED BEST MOLDS

Figure 1:
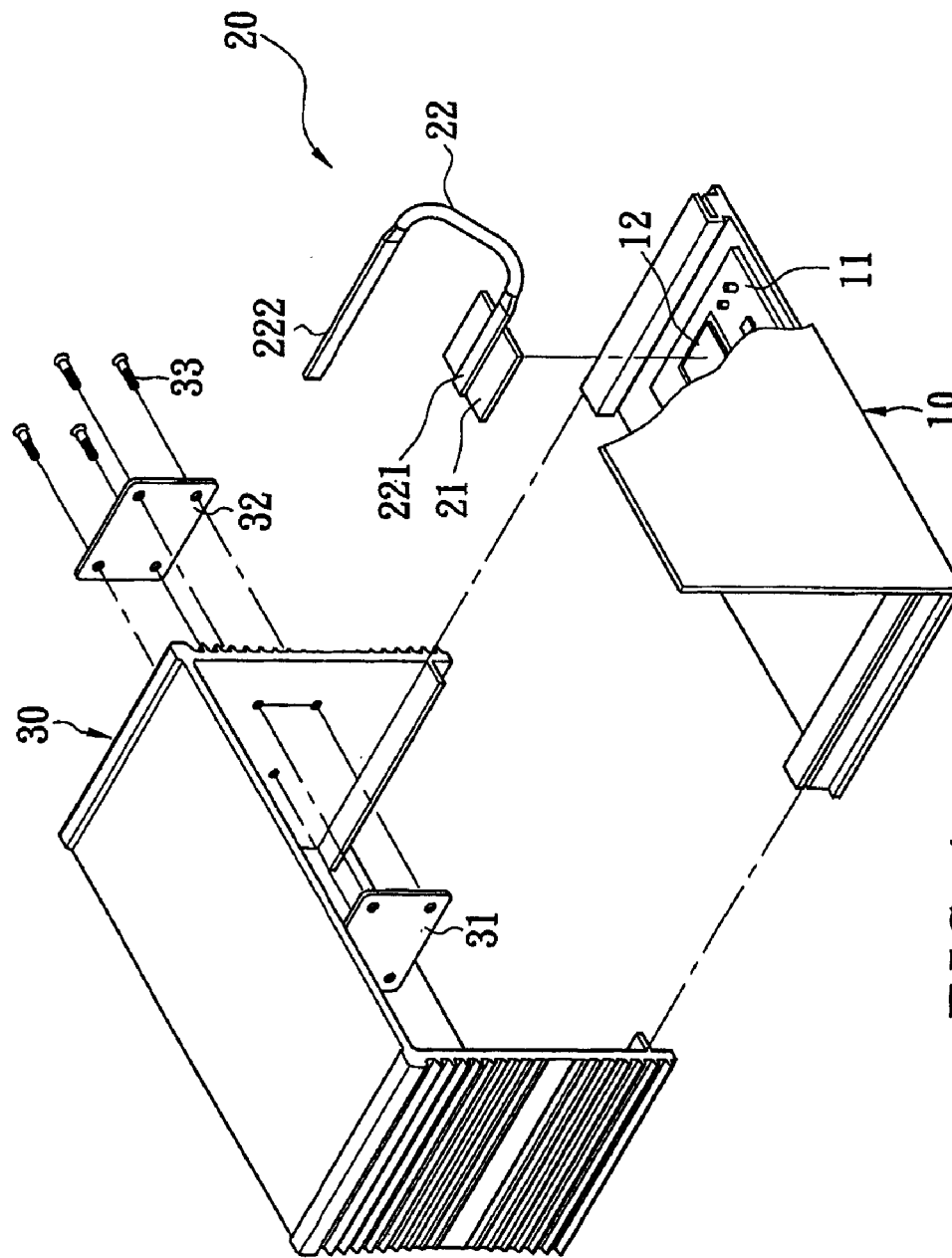
FIG. 1 is an exploded view of a heat-dissipating casing structure according to the first embodiment of the present invention.
Figure 2:
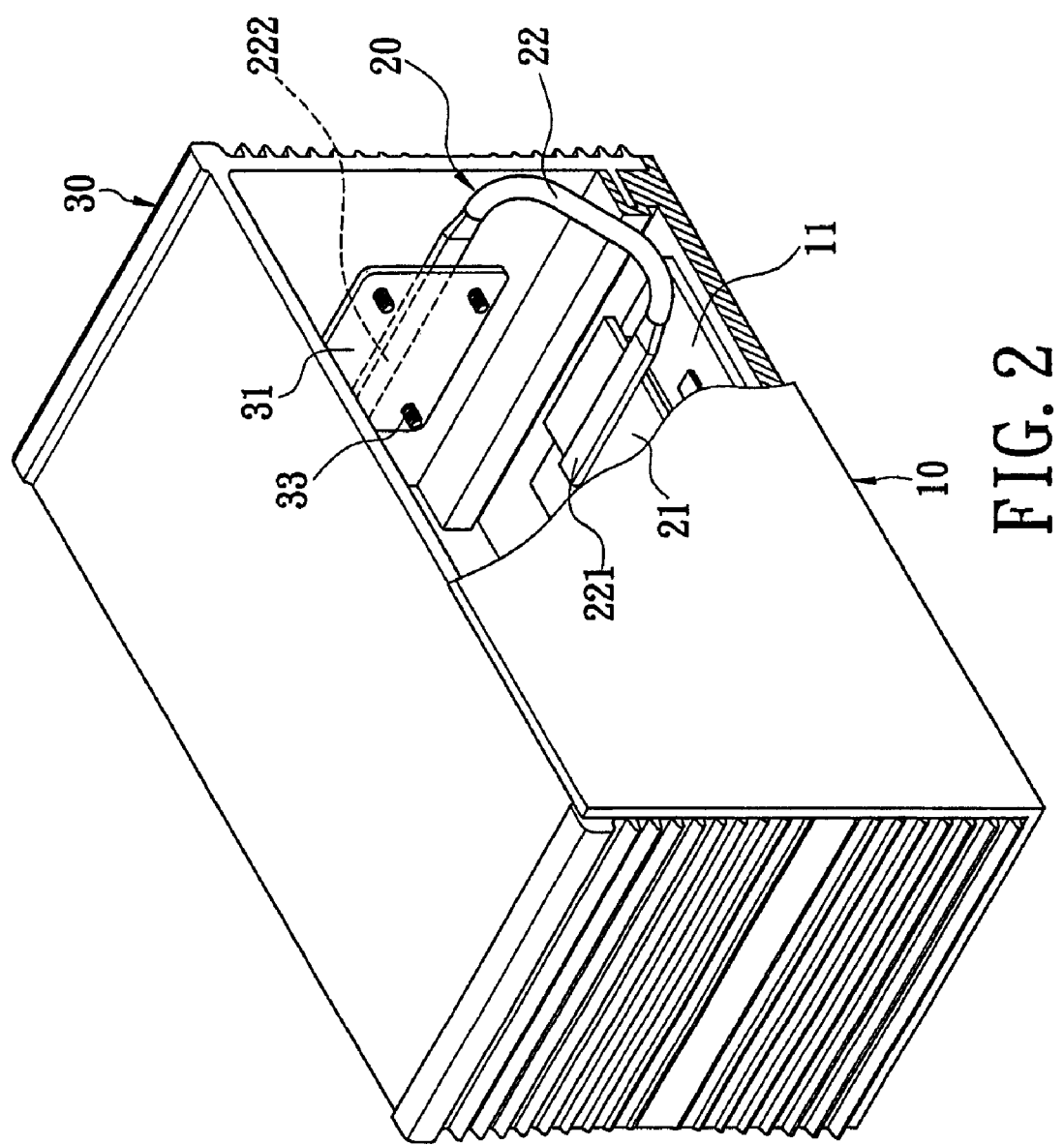
FIG. 2 is an assembled view of a heat-dissipating casing structure according to the first embodiment of the present invention.
Figure 3:
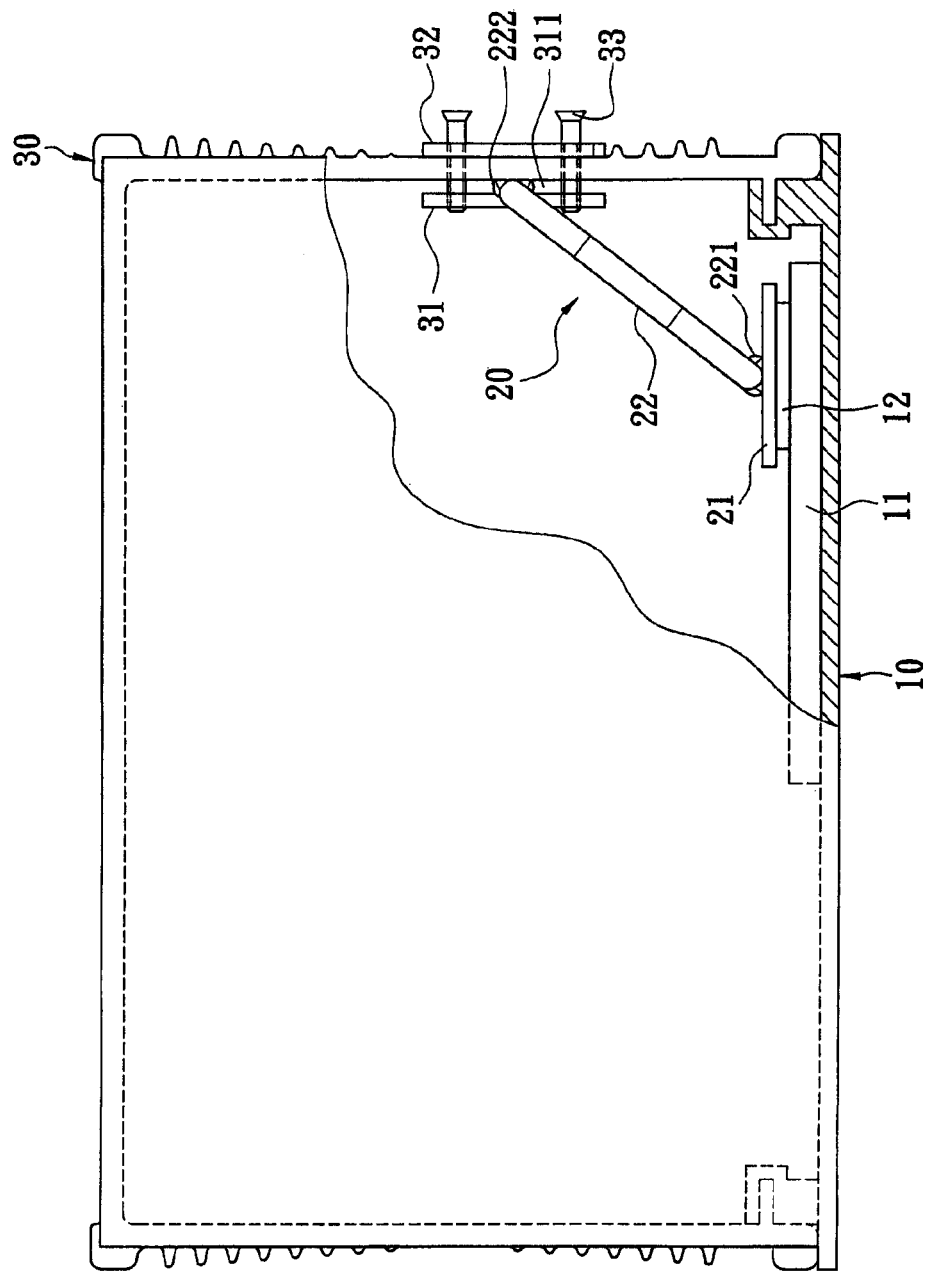
FIG. 3 is a front view of a heat-dissipating casing structure according to the first embodiment of the present invention.

Referring to FIGS. 1 to 3, the first embodiment of the present invention provides a heat-dissipating casing structure. The heat-dissipating casing structure comprises a base seat 10, a heat-dissipating module 20, and a casing 30. The base seat 10 has a PCB (Printed Circuit Board) 11 disposed thereon. The PCB 11 has a heat-generating element 12 such as CPU.

The heat-dissipating module 20 has a first heat-conducting block 21 and a first heat pipe 22. The heat-dissipating module 20 is screwed on the base seat 10 or is disposed on the base seat 10 by any fixing method. The first heat-conducting block 21 is made of heat-conducting metal material. The first heat-conducting block 21 is disposed on the heat-generating element 12 for absorbing heat from the heat-generating element 12.

In this embodiment, the first heat pipe 22 is bent in a U shape and has a first side 221 of a second side 222. The first side 221 connects with the first heat-conducting block 21. The second side 222 is bent upward from a rear end of the first side 221 and extends forward in a suspended status.

The casing 30 is made of metal material. The casing 30 can be slidably assembled on the base seat 10 in a horizontal direction as shown in FIG. 1 to complete assembly of a machine casing. The casing 30 has an installed portion. In the first embodiment, the installed portion includes a first spacer 31 and a second spacer 32 corresponding to the first spacer 31. The first spacer 31 is disposed on the inner wall of the casing 30 to form an inserted space 311 (as shown in FIG. 3) between the first spacer 31 and the inner wall of the casing 30. The inserted space 311 corresponds to the second side 222 of the first heat pipe 22. The second spacer 32 is attached to an outer wall of the casing 30. The first spacer 31 and the second spacer 32 are respectively disposed on two corresponding opposite sides of the casing 30 by several screws 33.

During the assembly process, the casing 30 is slidably assembled to the base seat 10 so that the second side 222 of the first heat pipe 22 can be inserted into the inserted space 311. The second side 222 of the first heat pipe 22 is clamped between the first spacer 31 and the inner wall of the casing 30 by matching the screws 33 and the first spacer 31. Therefore, the second side 222 of the first heat pipe 22 is attached closely to the inner wall of the casing 30 so that heat is transmitted from the heat-generating element 12 to the casing 30.

Figure 3A:
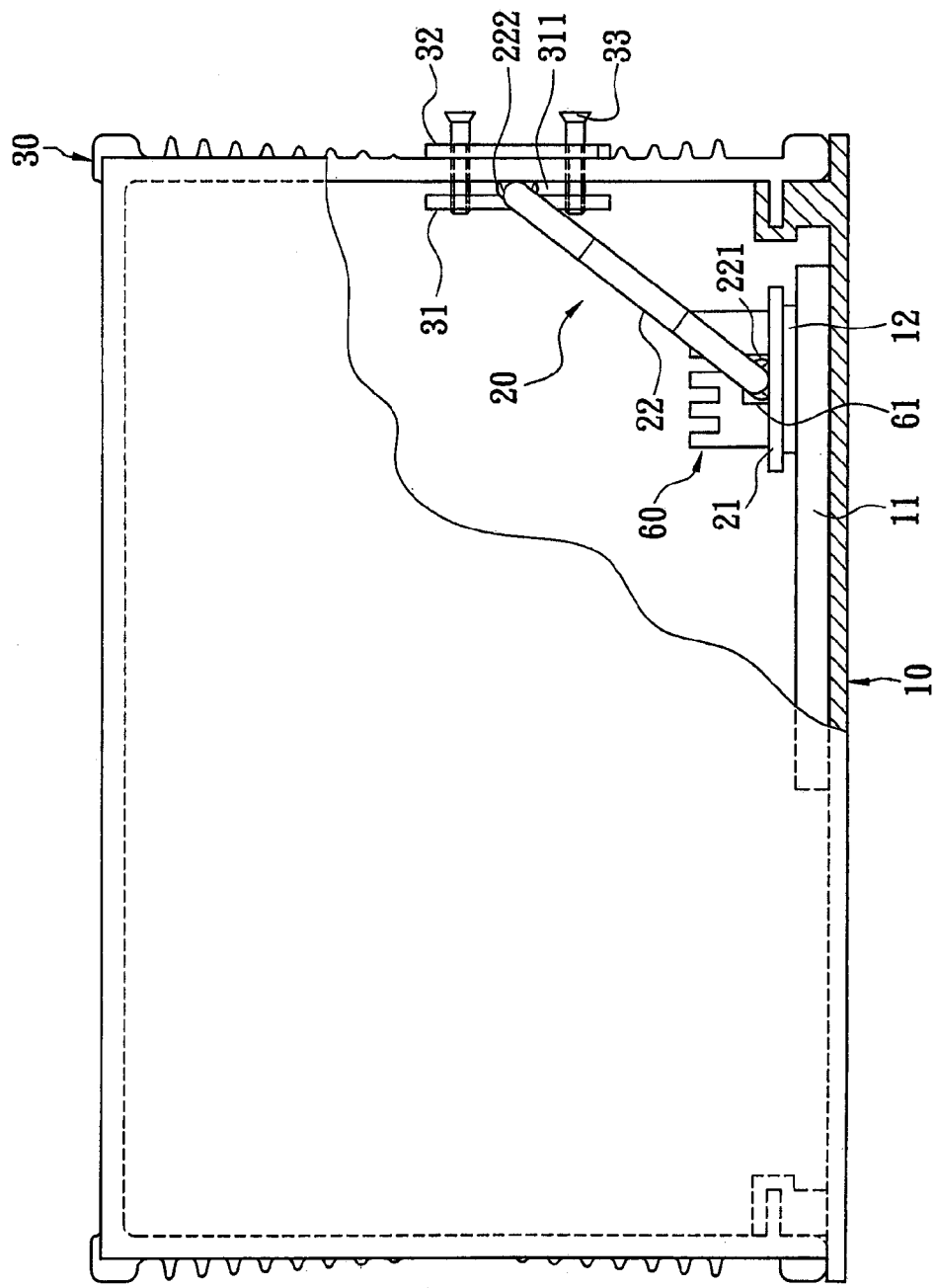
FIG. 3A is a front view of a heat-dissipating casing structure (a heat sink being disposed on a heat-conducting block) according to the first embodiment of the present invention.

Referring to FIG. 3A, the first heat-conducting block 21 has a heat sink 60 disposed thereon to help the first heat-conducting block 21 dissipate heat. The heat sink 60 has a concave groove 61 formed on a bottom face thereof for receiving the first side 221 of the first heat pipe 22.

Figure 4:
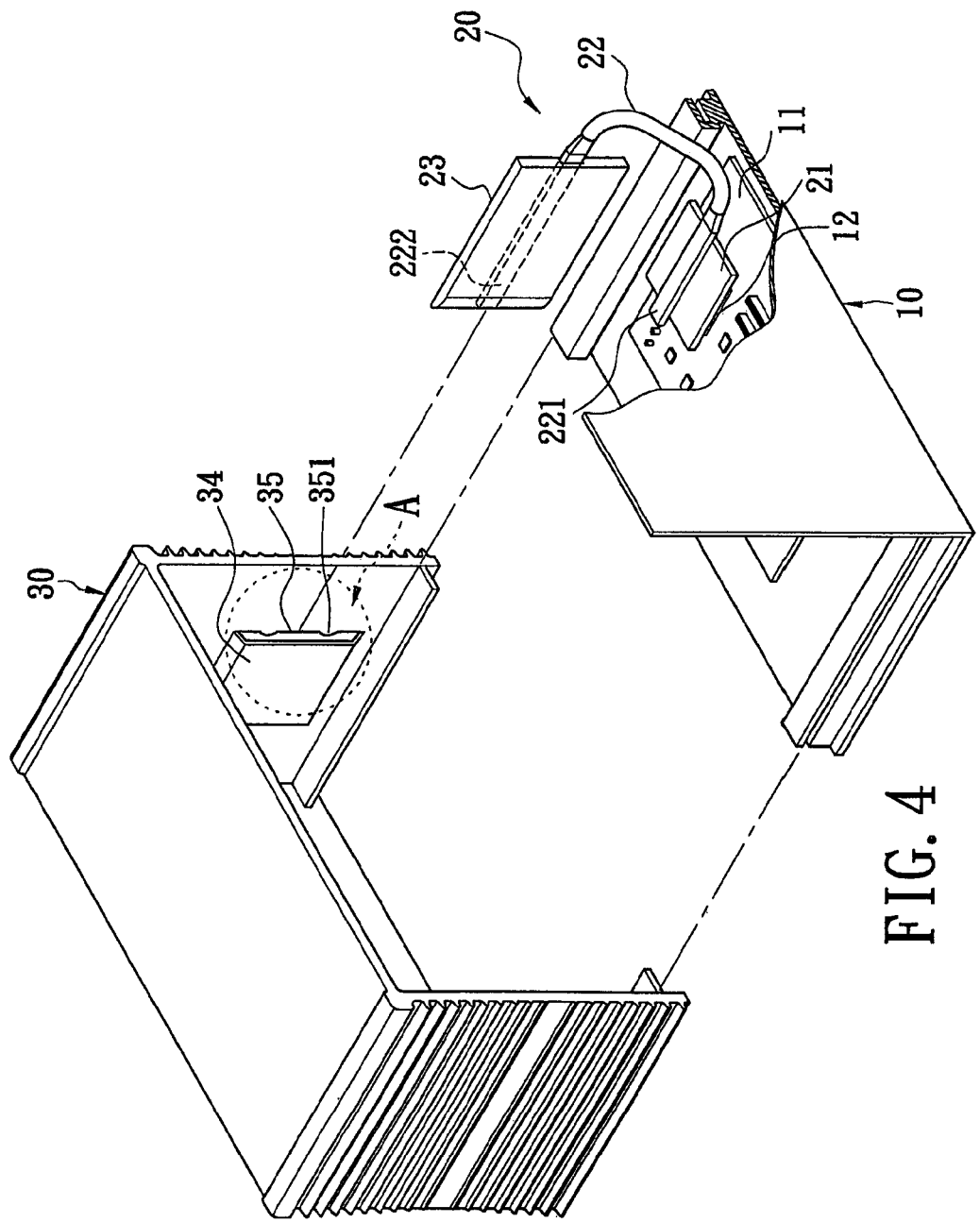
FIG. 4 is an exploded view of a heat-dissipating casing structure according to the second embodiment of the present invention.
Figure 4A:
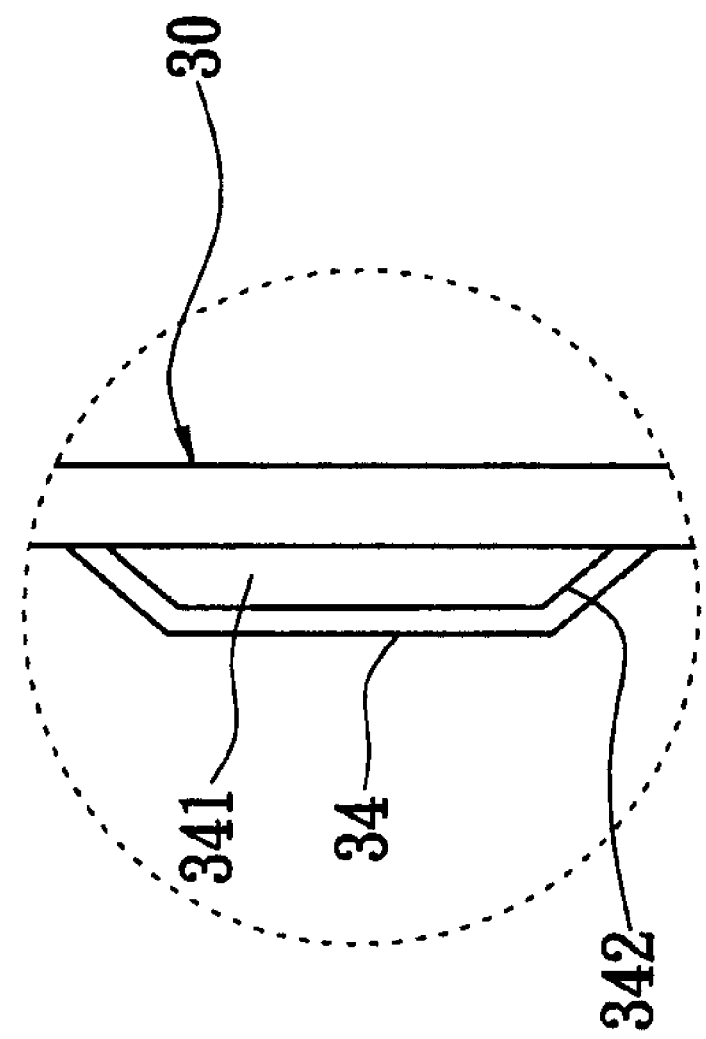
FIG. 4A is a lateral view of part A in FIG. 4.

FIGS. 4 and 4A show a second embodiment of the present invention. The difference between the second embodiment and the first embodiment is that the heat-dissipating module 20 further has a second heat-conducting block 23 connected with the second side 222 of the first heat pipe 22.

In this embodiment, the installed portion is a projected board 34. The projected board 34 is formed by punching the casing 30. The casing 30 has an opening 35 that corresponds to the projected board 34 and has at least two projected ears 351 respectively formed on two opposite inner walls of the opening 35. The projected board 34 is disposed on the inner wall of the casing 30 to form an inserted space 341 (as shown in FIG. 4A) between the projected board 34 and the inner wall of the casing 30. The casing 30 has an inserted opening 342 that corresponds to the inserted space 341.

During the assembly process, the casing 30 is slidably assembled to the base seat 10 in a horizontal direction so that the second heat-conducting block 23 passes through the inserted opening 342 and is inserted into the inserted space 341. The two projected ears 351 prevent the second heat-conducting block 23 from separating from the inserted space 341. The second heat-conducting block 23 is inserted into the inserted space 341 to join the installed portion that is the projected board 34. The second side 222 of the first heat pipe 22 joints with the casing 30 via the second heat-conducting block 23 and the projected board 34. Therefore, heat is transmitted from the heat-generating element 12 to the casing 30 through the first heat-conducting block 21, the first heat pipe 22, the second heat-conducting block 23, and the projected board 34 in sequence.

Figure 5:
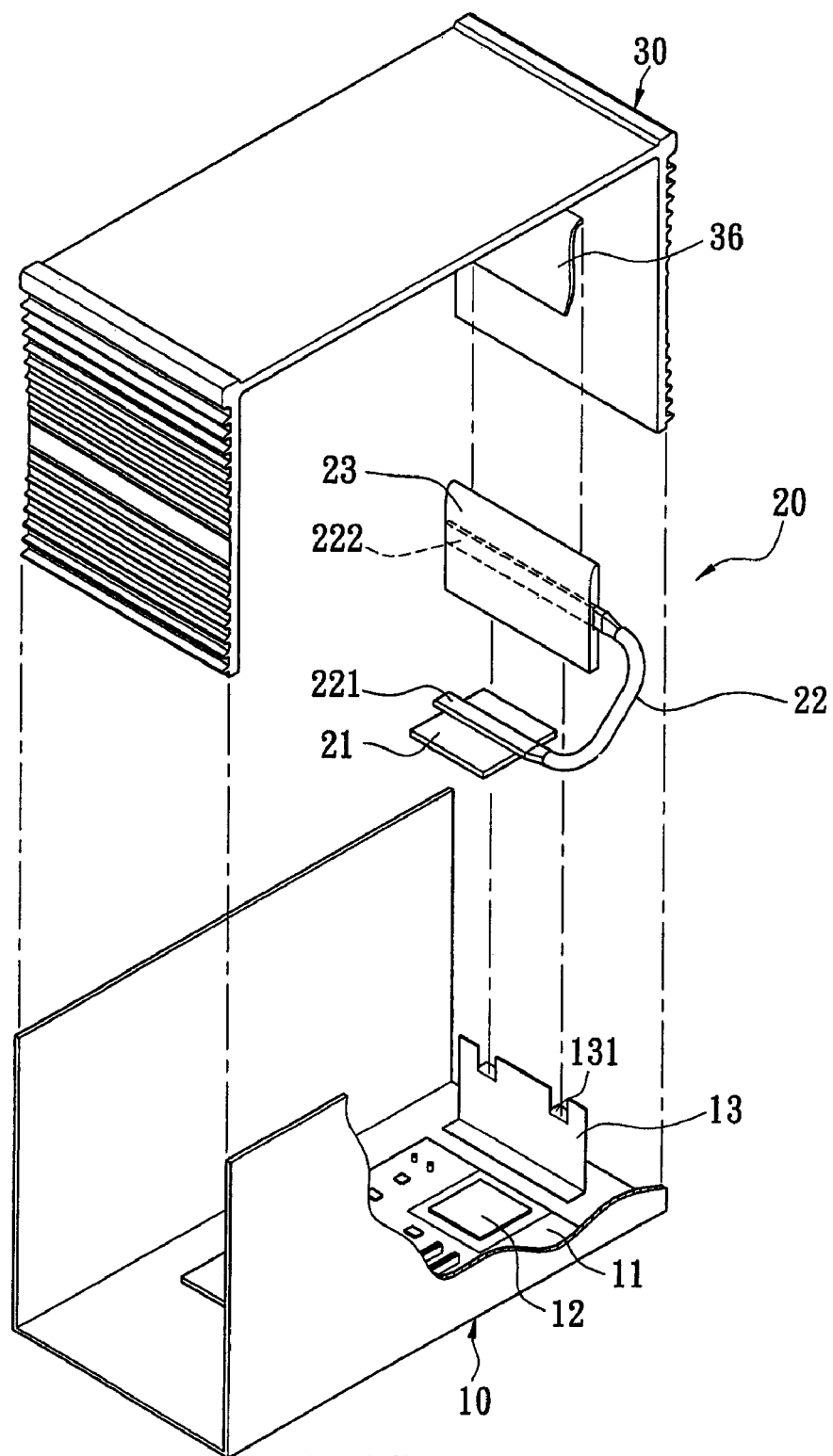
FIG. 5 is an exploded view of a heat-dissipating casing structure according to the third embodiment of the present invention.
Figure 6:
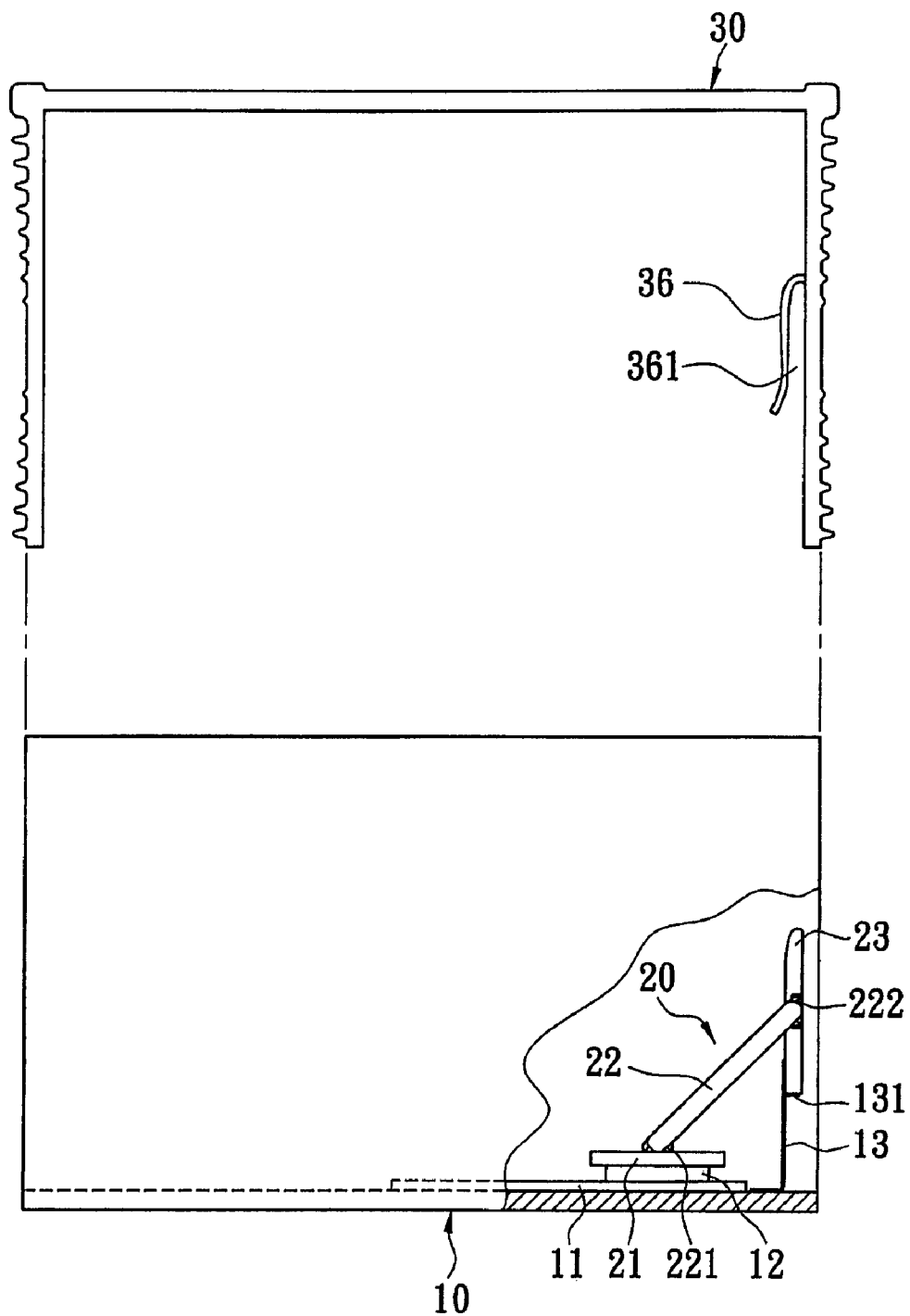
FIG. 6 is a front view of a heat-dissipating casing structure according to the third embodiment of the present invention.
Figure 7:
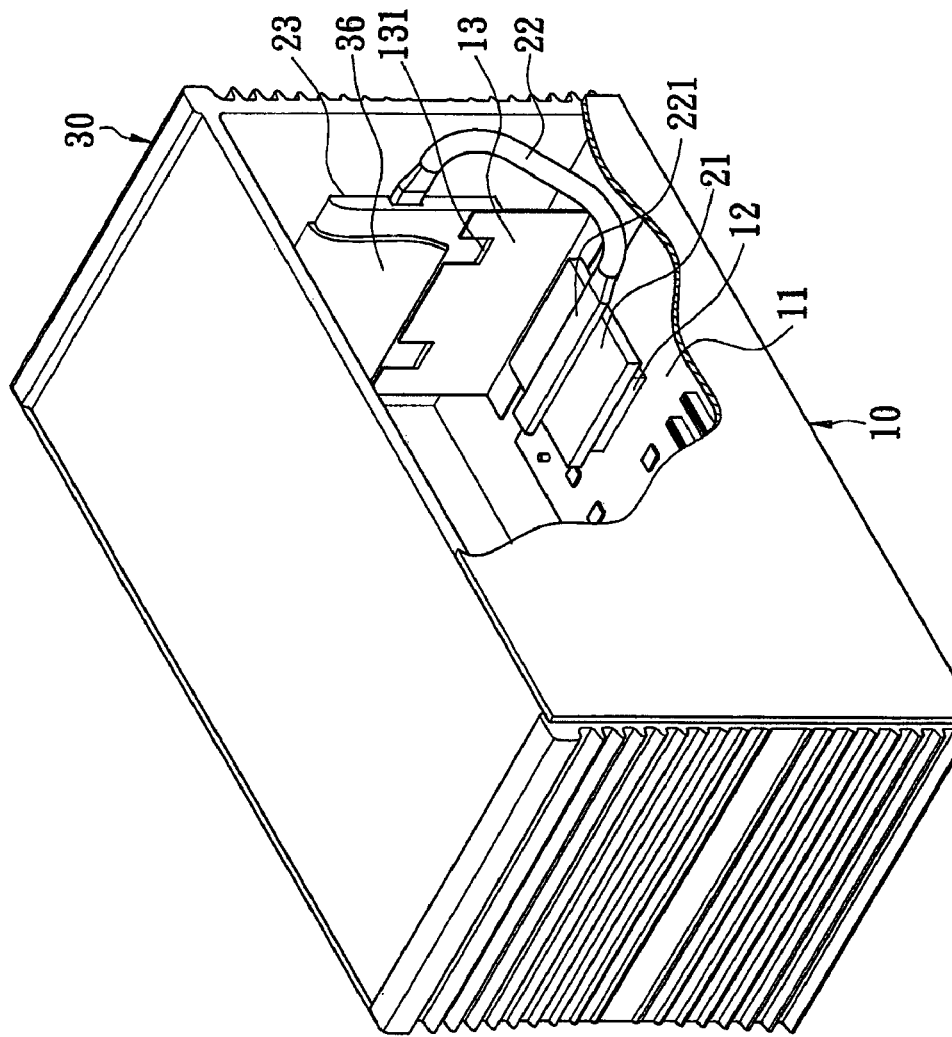
FIG. 7 is an assembled view of a heat-dissipating casing structure according to the third embodiment of the present invention.

FIGS. 5 to 7 show a third embodiment of the present invention. The difference between the third embodiment and the second embodiment is that the casing 30 is slidably assembled to the base seat 10 in a vertical direction. In this embodiment, the installed portion is an elastic piece 36 that has the property of being flexible. The elastic piece 36 can be welded, retained, or screwed on the casing 30; Alternatively, the elastic piece 36 can be integrated with the casing 30. The elastic piece 36 has the property of elasticity and is bent inward and downward from the inner wall of the casing 30. A top side of the elastic piece 36 connects to the casing 30. A bottom side of the elastic piece 36 is a free end. The elastic piece 36 is disposed on the inner wall of the casing 30 to form a clipping space 361 (as shown in FIG. 6) between the elastic piece 36 and the inner wall of the casing 30 for receiving the second heat-conducting block 23.

The base seat 10 has at least one joint piece 13 corresponding to the second heat-conducting block 23. The joint piece 13 is bent and extended to form two abutting portions 131. The two abutting portions 131 are separated from each other by a predetermined distance, and abut against a bottom side of the second heat-conducting block 23 for supporting the second heat-conducting block 23.

During the assembly process, the casing 30 is slidably assembled to the base seat 10 from an upward direction to a downward direction. The second heat-conducting block 23 is clamped in the clipping space 361 via the elasticity of the elastic piece 36 to join the second heat-conducting block 23 with the installed portion that is the elastic piece 36. The second side 222 of the first heat pipe 22 joints with the casing 30 via the second heat-conducting block 23 and the elastic piece 36 to transmit heat from the heat-generating element 12 to the casing 30.

Figure 8:
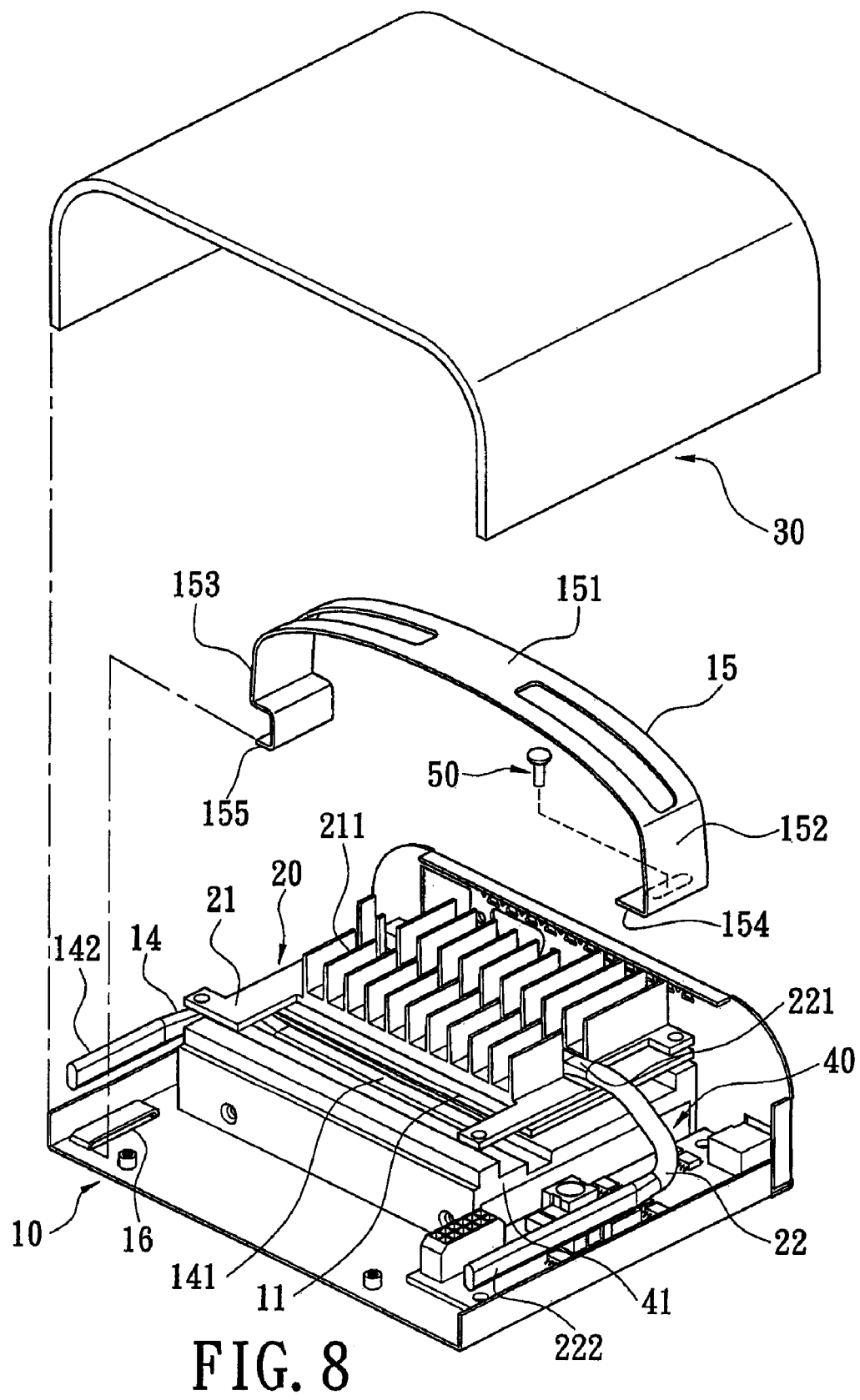
FIG. 8 is an exploded view of a heat-dissipating casing structure according to the fourth embodiment of the present invention.
Figure 9:
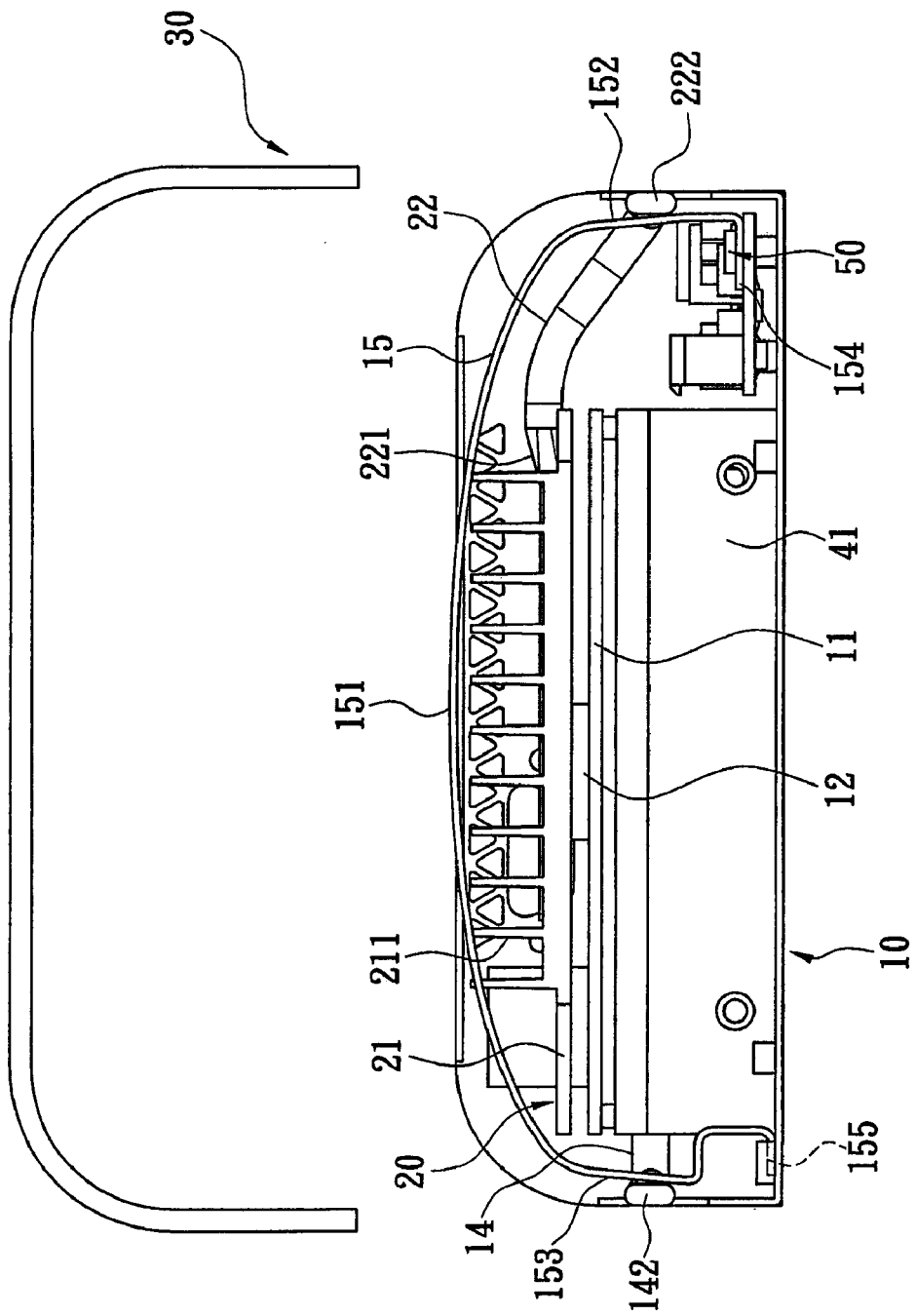
FIG. 9 is a front view of a heat-dissipating casing structure (before the casing covers the base seat) according to the fourth embodiment of the present invention.
Figure 10:
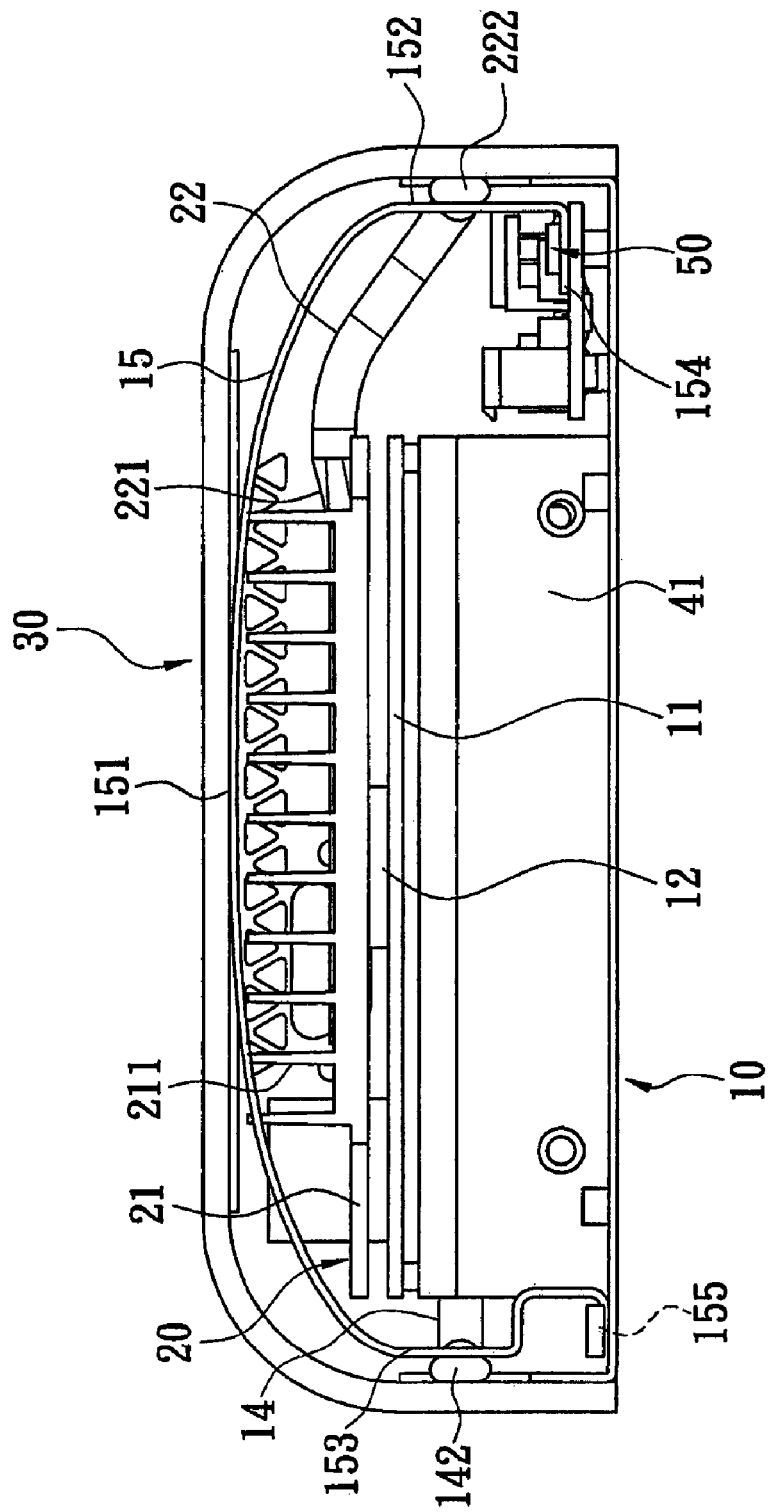
FIG. 10 is a front view of a heat-dissipating casing structure (after the casing covers the base seat) according to the fourth embodiment of the present invention.

FIGS. 8 to 10 show a fourth embodiment of the present invention. A hard disk 40 is assembled on the base seat 10. A hard disk support 41 is covered on the hard disk 40. The PCB 11 is disposed on the hard disk support 41 and has a heat-generating element 12 (as shown in FIG. 9). The heat-dissipating casing structure further comprises a second heat pipe 14 that includes a first side 141 and a second side 142. The first side 141 connects to the hard disk support 41. The second side 142 extends from one end of the first side 141 to a lateral side of the base seat 10. The heat-dissipating module 20 has a first heat-conducting block 21 and a first heat pipe 22. The heat-dissipating module 20 is disposed on the base seat 10. The first heat-conducting block 21 has a vertical type heat sink 211 disposed thereon. The first heat-conducting block 21 is attached to the heat-generating element 12.

The first side 221 of the first heat pipe 22 connects with the first heat-conducting block 21. The second side 222 extends from one end of the first side 221 to the lateral side of the base seat 10.

In this embodiment, the installed portion is an elastic piece 15. The second side 222 of the first heat pipe 22 and the second side 142 of the second heat pipe 14 are respectively disposed on two opposite sides of the elastic piece 15. The elastic piece 15 has a pressing section 151 with an arc shape under the casing 30. The pressing section 151 has a height higher than that of the base seat 10. The elastic piece 15 further has a first interfered section 152 and a second interfered section 153 extended from two sides of the pressing section 151. A bottom side of the first interfered section 152 is bent inward and extended to form a first fixed section 154. The first fixed section 154 is screwed and assembled on the base seat 10 by a screw element that is a screw 50.

A bottom side of the second interfered section 153 is bent inward and extended to form a second fixed section 155. The base seat 10 is punched to form an inserted opening 16 that corresponds to the second fixed section 155. The second fixed section 155 is inserted into the inserted opening 16. Therefore, the movement of the elastic piece 15 is limited by matching the first fixed section 154, the second fixed section 155, and the base seat 10.

The base seat 10 can be punched to form another inserted opening (not shown), in order to insert the first fixed section 154 into the inserted opening (not shown). Therefore, the first fixed section 154 is assembled on the base seat 10 without using the screw 50.

When the casing 30 is slidably assembled to the base seat 10 from an upward direction to a downward direction, the inner wall of the casing 30 downward abuts against the pressing section 151 to make the elastic piece 15 deformed. Hence, the two interfered sections 152, 153 are spread outward so that the first interfered section 152 and the inner wall of the casing 30 respectively abut against two opposite sides of the second side 222 of the first heat pipe 22, and the second interfered section 153 and the inner wall of the casing 30 respectively abut against two opposite sides of the second side 142 of the second heat pipe 14. Therefore, the second side 222 of the first heat pipe 22 and the second side 142 of the second heat pipe 14 are respectively clamped between the inner wall of the casing 30 and the two interfered sections 152, 153 to transmit heat from the heat-generating element 12 and the hard disk 40 to the casing 30 through the two heat pipes 22, 14.

Figure 11:
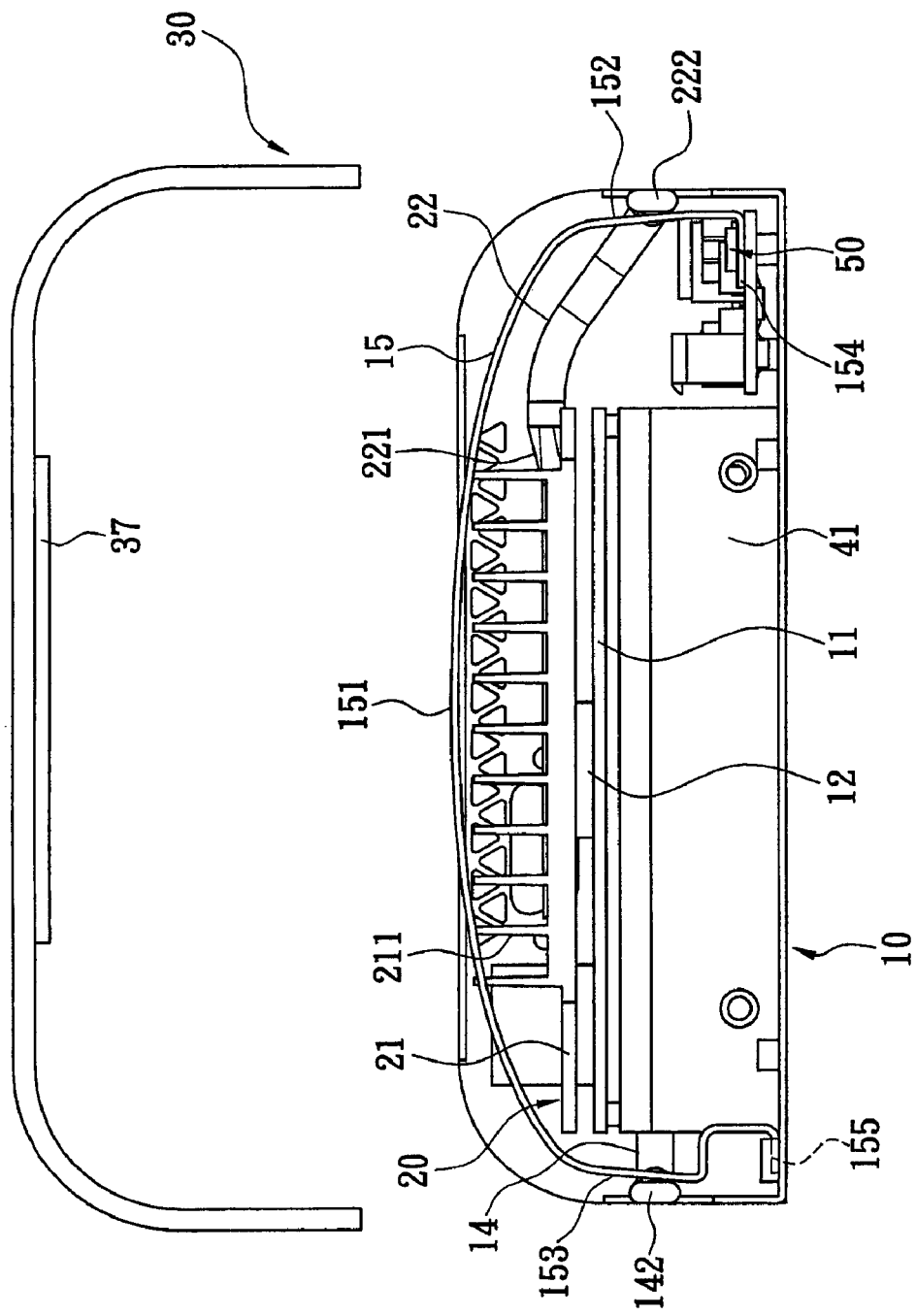
FIG. 11 is a front view of a heat-dissipating casing structure (before another casing covers the base seat) according to the fourth embodiment of the present invention.

Moreover, the casing 30 has a pressing portion 37 (as shown in FIG. 11) that corresponds to the pressing section 151 of the elastic piece 15 for pressing the pressing section 151 downward.

Furthermore, the first heat pipe 22 is connected to the casing 30 or the base seat 10 via the installed portion. Hence, the heat-dissipating module 20 can be assembled and replaced easily and rapidly. Moreover, the heat from the heat-generating element 12 is transmitted to the casing 30 with a larger heat-dissipating area for increasing heat-dissipating efficiency.

Furthermore, the second heat pipe 14 corresponding to the first heat pipe 22 is added to the heat-dissipating casing structure so that the two interfered sections 152, 153 are spread outward to abut downward against the pressing section 151 after the casing 30 is slidably assembled to the base seat 10 from an upward direction to a downward direction. In addition, the second side 222 of the first heat pipe 22 and the second side 142 of the second heat pipe 14 connect with the inner wall of the casing 30. Therefore, heat from the heat-generating element 12 and the hard disk 40 is transmitted to the casing 30 through the two heat pipes 22, 14 for increasing the heat-dissipating speed.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A heat-dissipating casing structure disposed on a host computer, comprising:
    a casing;
    a base seat slideably received within said casing for forming an enclosure when said casing and said base seat are joined;
    a heat-generating element defining a portion of said computer; and
    a replaceable heat-dissipating module disposed within said enclosure;
        said heat-dissipating module having a first heat-conducting block mounted contiguous said heat-generating element and a second heat-conducting block contiguous to a sidewall of said casing, said first and second heat conducting blocks being connected by a heat pipe extending from said first heat conducting block to said second heat conducting block.

2. The heat-dissipating casing structure as claimed in claim 1, wherein the installed portion includes a first spacer and a second spacer corresponding to the first spacer, the first spacer and the second spacer are respectively disposed on two corresponding inner and outer walls of the casing, and the other side of the heat pipe is disposed between the first spacer and the inner wall of the casing.

3. The heat-dissipating casing structure as claimed in claim 2, wherein the first spacer is disposed on the inner wall of the casing to form an inserted space between the first spacer and the inner wall of the casing for receiving the other side of the heat pipe.

4. The heat-dissipating casing structure as claimed in claim 1, wherein the heat-dissipating module further has a second heat-conducting block connected with the other side of the heat pipe and combined with the installed portion of the casing.

5. The heat-dissipating casing structure as claimed in claim 4, wherein the installed portion is a projected board disposed on an inner wall of the casing to form an inserted space between the projected board and the inner wall of the casing, the casing has an inserted opening corresponding to the inserted space, and the second heat-conducting block is inserted into the inserted space to join with the projected board.

6. The heat-dissipating casing structure as claimed in claim 5, wherein the casing has an opening corresponding to the projected board and has at least two projected ears respectively formed on two opposite inner walls of the opening.

7. The heat-dissipating casing structure as claimed in claim 4, wherein the installed portion is an elastic piece disposed on an inner wall of the casing to form a clipping space between the elastic piece and the inner wall of the casing, and the second heat-conducting block is clamped in the clipping space.

8. The heat-dissipating casing structure as claimed in claim 7, wherein the elastic piece is welded, retained, or screwed on the casing.

9. The heat-dissipating casing structure as claimed in claim 7, wherein the elastic piece is integrated with the casing.

10. The heat-dissipating casing structure as claimed in claim 7, wherein the base seat has at least one joint piece corresponding to the second heat-conducting block, and the joint piece abuts against the second heat-conducting block.

11. The heat-dissipating casing structure as claimed in claim 10, wherein the joint piece has at least one abutting portion, and the abutting portion abuts against one side of the second heat-conducting block.

12. The heat-dissipating casing structure as claimed in claim 1, wherein the first heat-conducting block has a heat sink disposed thereon.

13. A heat-dissipating casing structure, comprising:
- a base seat having an installed portion; wherein said installed portion is an elastic piece having a pressing section and interfered section extended from one lateral side of the pressing section;
- a replaceable heat-dissipating module disposed on the base seat, wherein the heat-dissipating module has a first heat-conducting block and a first heat pipe, and one side of the first heat pipe connects to the first heat-conducting block; said first heat-conducting block disposed directly on a heat-generating element; and
- a detachable casing slidably assembled on the base seat for connecting the other side of the first heat pipe with the casing via the installed portion;
- wherein the pressing section is disposed under the detachable casing, the detachable casing abutting against the pressing section, and the interfered section and an inner wall of the casing respectively abut against two opposite sides of the other side of the first heat pipe.

14. The heat-dissipating casing structure as claimed in claim 13, wherein the pressing section is an arc-shaped.

15. The heat-dissipating casing structure as claimed in claim 13, wherein the interfered section is bent and extended to form a fixed section, and the fixed section is assembled on the base seat.

16. The heat-dissipating casing structure as claimed in claim 15, wherein the fixed section is screwed and assembled on the base seat by a screw element.

17. The heat-dissipating casing structure as claimed in claim 15, wherein the base seat has an inserted opening, and the fixed section is inserted into the inserted opening.

18. The heat-dissipating casing structure as claimed in claim 13, further comprising a second heat pipe, wherein one side of the second heat pipe and the other side of the first heat pipe are respectively disposed on two opposite sides of the elastic piece, the elastic piece has another interfered section extended from the other lateral side of the pressing section, and the other side of the first heat pipe and the one side of the second heat pipe are respectively clamped between the inner wall of the casing and the two interfered sections.

19. The heat-dissipating casing structure as claimed in claim 13, wherein the casing has a pressing portion corresponding to the pressing section.

* * * * *